(12) United States Patent
Lee et al.

(10) Patent No.: US 6,479,982 B1
(45) Date of Patent: Nov. 12, 2002

(54) ROTATOR FOR A MODULE INTEGRATED CIRCUIT (IC) HANDLER

(75) Inventors: Sang Soo Lee, Choongchungnam-do (KR); Wan Gu Lee, Choongchungnam-do (KR); Jong Won Kim, Kyungki-do (KR); Hee Soo Kim, Kyungki-do (KR); Young Hak Oh, Kyungki-do (KR); Dong Chun Lee, Seoul (KR)

(73) Assignee: Mirae Corporation, Ichon (KR)

( * ) Notice: Subject to any disclaimer, the term of this patent is extended or adjusted under 35 U.S.C. 154(b) by 0 days.

(21) Appl. No.: 09/449,574

(22) Filed: Nov. 29, 1999

(30) Foreign Application Priority Data

Nov. 28, 1998 (KR) ............................................. 98-51508
Nov. 28, 1998 (KR) ............................................. 99-51509

(51) Int. Cl.$^7$ ............................................. G01R 31/02
(52) U.S. Cl. ..................................... 324/158.1; 324/758
(58) Field of Search ............................. 324/758, 158.1; 414/223.01, 421, 806, 754, 225.01, 778

(56) References Cited

U.S. PATENT DOCUMENTS

| | | | | |
|---|---|---|---|---|
| 5,906,472 A | * | 5/1999 | Nakarmura | 414/798.1 |
| 5,944,475 A | * | 8/1999 | Bonora et al. | 414/754 |
| 6,019,564 A | * | 2/2000 | Kiyokawa et al. | 414/223 |
| 6,089,635 A | * | 7/2000 | Lee | 294/88 |

\* cited by examiner

*Primary Examiner*—Michael Sherry
*Assistant Examiner*—Paresh Patel
(74) *Attorney, Agent, or Firm*—Fleshner & Kim, LLP (57) ABSTRACT

There is disclosed a rotator for a module IC handler, including a loading side rotator for 90-degrees changing a direction of a carrier and supplying it to the inside of a heating chamber, and an unloading side rotator for 90-degrees changing a direction of the carrier after being vertically contacted in a test site and for transferring it to the unloading location. The rotator according to the invention includes a loading side rotator, and an unloading side rotator, the loading side rotator having a driving unit, a transferring member, a holding unit for holding or releasing the carrier, and a removal/insertion unit for introducing or discharging the transferring member into or from the rotating plate, the unloading side rotator having a rotating plate, a driving unit and a holding unit.

23 Claims, 12 Drawing Sheets

ROTATOR FOR A MODULE INTEGRATED CIRCUIT (IC) HANDLER

BACKGROUND OF THE INVENTION

1. Field of the Invention

The present invention relates to a rotator for a module IC (Integrated Circuit) handler, and more particularly to a rotator for a module IC handler having a loading side rotator for 90-degree changing of direction of a carrier and supplying it to the inside of a heating chamber, and an unloading side rotator for 90-degrees changing of direction of the carrier after vertically contacting the module ICs contained in a test site and for transferring it to the unloading location.

2. Background of the Related Art

Typically, a module IC refers to a structure provided with a substrate whose one side or both sides thereof are used for fixedly mounting a plurality of ICs and electric components, for example, by soldering, and has a function for extending a capacity when it is coupled to a mother substrate.

In the prior art, there has been no apparatus for automatically loading the module ICs as final products into a test. socket, testing the same, classifying into respective categories depending upon the test results and then unloading the classified modules into the customer trays (not shown).

For this reason, to test the final product of the module IC, the operator manually has to pick up one piece of the module IC from the test tray in which the module ICs are contained, load it into a test socket, conduct the tests for a preset time period, and finally classify the module IC depending upon the test results in order to put it into the customer tray. This results in lower productivity due to manual work. Further, such tedious repeated manual work contributes to lower productivity.

However, since the modules ICs are held by the pick-up means and then transferred to the test socket, such a module IC handler has the following drawbacks.

Firstly, since the module ICs are held by the pick-up means and then loaded or unloaded to or from the test socket and the handling of the module ICs by the pick-up means is not possible within a sealed chamber, the module ICs are inevitably tested only under a room temperature.

The module ICs produced are tested at a room temperature and then distributed when they are determined to be good, but an actual use of the distributed module ICs when applied to an electric products generates heat under which the module ICs are driven. Thus, difference between conditions at the test for the module IC and conditions at an actual use thereof occurs and thus reduces reliability of the product distributed.

Finally, since the pickup means loads the module ICs contained in the test socket horizontally located in the test site, the test socket is inevitably, horizontally installed in the test site. Thus, inconvenient exchange work of the socket assembly mounted on a bottom surface of the test site is accompanied whenever the module IC is changed.

SUMMARY OF THE INVENTION

Therefore, an object of the present invention is to further improve reliability of distributed module IC products by conducting the performance tests for module ICs under a predetermined constant temperature.

Another object of the present invention is to, in the test site, vertically contact the module ICs contained in the carrier to the test socket by enabling transfer of the carrier, whose direction is 90-degrees changed, to the inside of the heating chamber.

Further, another object of the present invention is to, in the unloading location, enable unloading of the tested module ICs by returning the carrier vertically contacted with the test socket in the test site to a horizontal state thereof.

To accomplish the above object, there is provided a rotator for a module IC handler, the rotator comprising: a loading side rotator, and an unloading side rotator, the loading side rotator including a driving means, a transferring member, a first holding means for holding or releasing the carrier, a first rotating plate, and a first removal/insertion means for introducing or discharging the transferring member into or from the first rotating plate, and the unloading side rotator including a second rotating plate, an unloading side driving means, and a second holding means.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A rotator of a module IC handler according to the present invention will be described in detail, with reference to the accompanying drawings.

Figure 1:
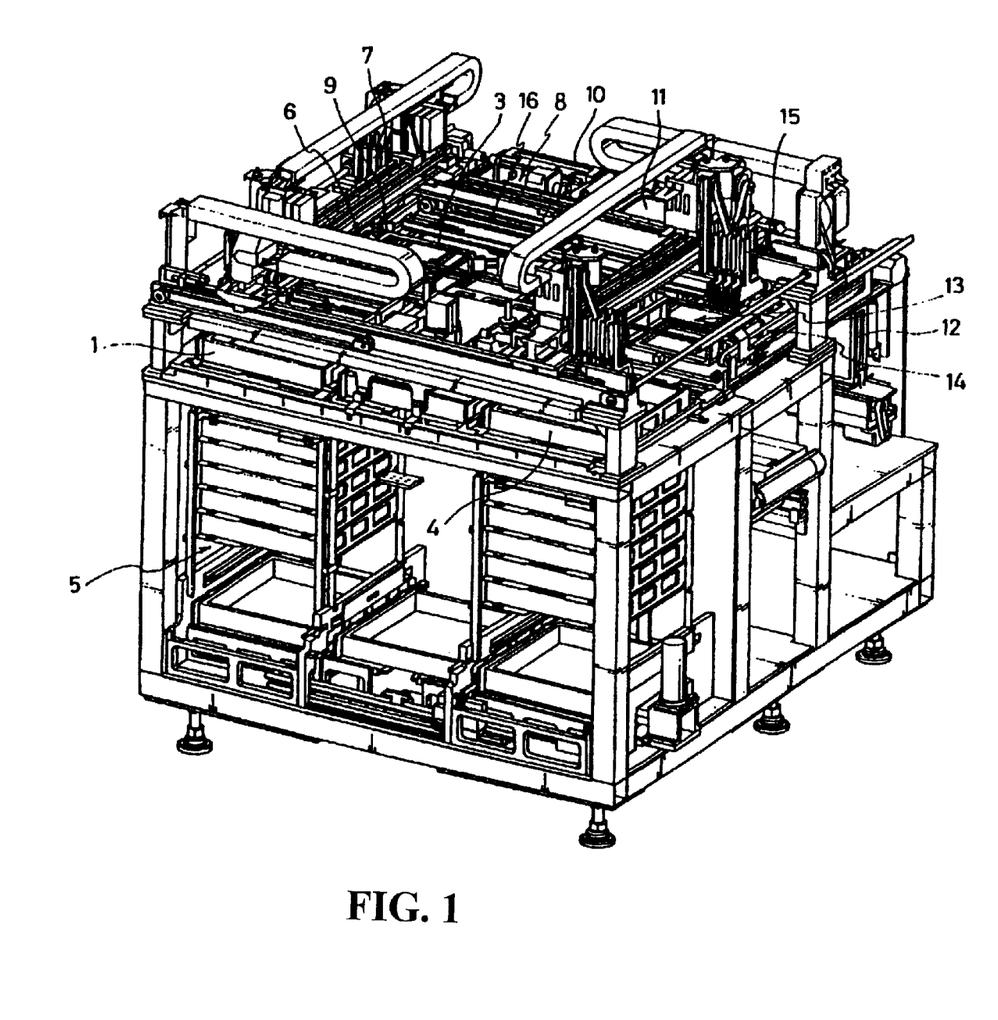
FIG. 1 is a perspective view of a module IC handler to which the present invention is applied.
Figure 2:
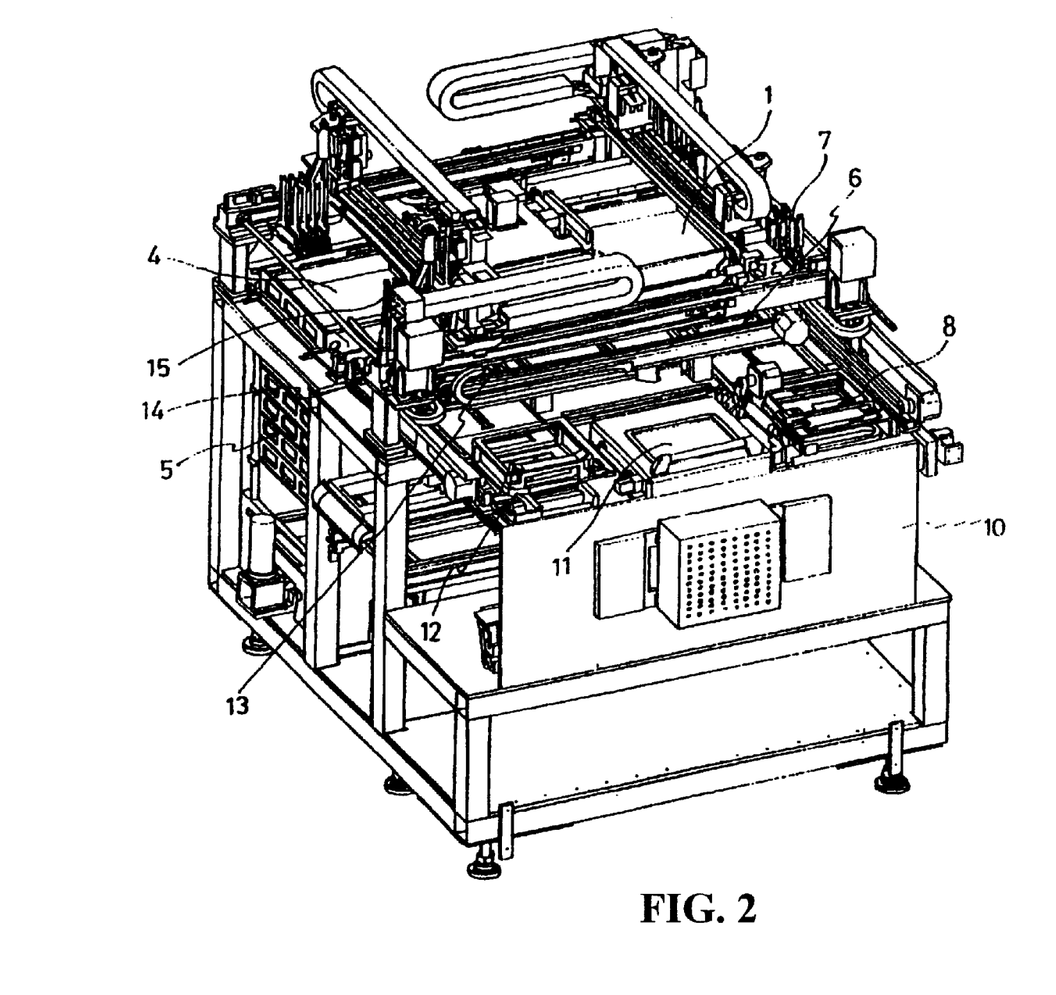
FIG. 2 is a rear side perspective view of FIG. 1.

As shown in FIGS. 1 and 2, a module IC handler of the present invention includes: an elevation unit 5, a loading side pick-up means 7, a first transferring means 9, a loading side rotator 8, a heating chamber 10, a test site 11, an unloading side rotator 12, a second transferring means 14, an unloading side pick-up means 15, a third transferring means 16, etc.

The elevation unit 5 is operated to sequentially elevate a stack plate used for placing a first tray 1 thereon in one step when the module IC contained in said first tray 1 is loaded into a carrier 3, or to sequentially lower the stack plate by one step when the tested and classified module ICs are unloaded into customer trays 4.

The loading side pick-up means 7 is used for sequentially holding the module ICs contained in the first tray 1 and loading the module ICs into the carrier 3 located in the loading location 6.

The first transferring means 9 is used for transferring the carrier to the loading side rotator 8 when the carrier completely receives the module ICs to be tested.

The loading side rotator 8 is operated to rotate the carrier 3 by 90-degrees when the carrier 3 is transferred by the first transferring means 9.

The heating chamber 10, disposed below the loading side rotator 8, is used for heating the module ICs to a temperature suitable for the tests when the carriers are sequentially transferred by the loading side rotator 8.

The test site 11, disposed at one side of the heating chamber 10, is provided so that a module IC can be heated to a temperature suitable for testing. When the carrier arrives at the test site, the carrier is pushed onto the test socket and the tests for the module ICs are performed for a preset time period.

The unloading side rotator 12, provided at one side of the test site 11, is operated to rotate the carrier by 90-degrees when the carrier with tested module ICs is transferred thereto.

The second transferring means 14 is used for horizontally transferring the carrier 3 from the unloading side rotator 12 to the unloading location 13.

The unloading side pick-up means 15 is used for selectively holding the module IC transferred thereto by the second transferring means 14, based upon the test results, and for unloading the module ICs into the customer tray 4.

The third transferring means 16 is used for horizontally transferring an empty carrier depleted of the module ICs to the loading location 6.

The module IC handler thus constructed needs to have the loading side rotator 8 and the unloading side rotator 12, wherein the loading side rotator 8 is operated to rotate the carrier in which the module ICs to be tested are contained in order to vertically contact the heated module ICs with the test socket, and wherein the unloading side rotator 12 is operated to return the upright carrier to a horizontal status in order to unload the tested module ICs.

The rotator of the module IC handler according to the present invention is comprised of the loading side rotator 8 and the unloading side rotator 12.

As shown in FIGS. 3 to 5b, the loading side rotator 8 has a first rotating plate 18 rotatably mounted on an upper side of a shutter which is installed on the heating chamber 10 and which may be opened and closed (see FIG. 1). The configuration of the first rotating plate 18 is such that the rotation range of the rotator plate 18 is within 90 degrees when it is driven by a driving means. The first rotating plate 18 is further provided with a transferring member 19 that may be removed therefrom and into which the carrier containing the module ICs to be tested is inserted.

Figure 3:
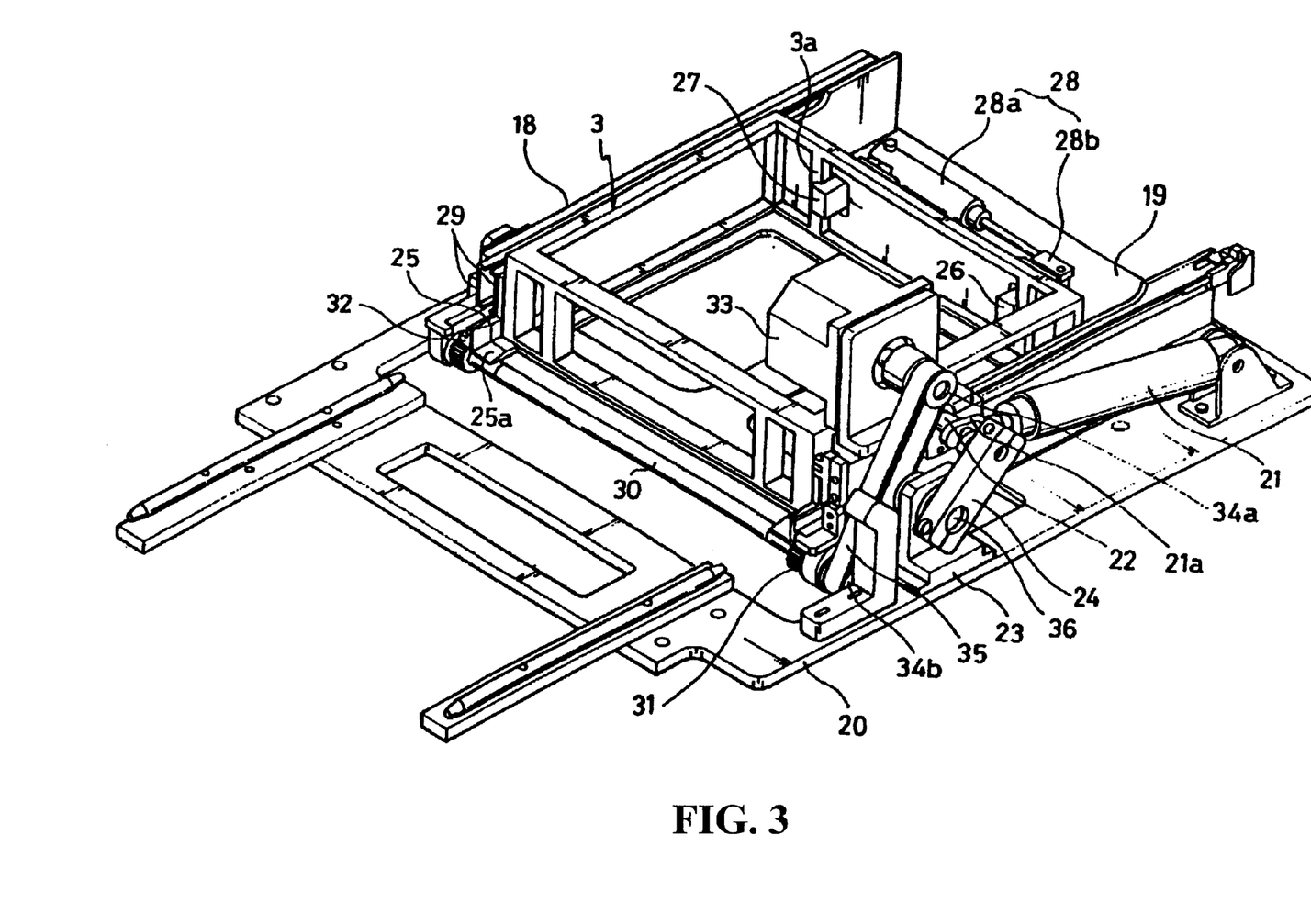
FIG. 3 is a perspective view of a loading side rotator as one of the main components of the invention.

The loading side driving means includes a first cylinder 21 having a first cylinder end hingedly coupled to a first installation plate 20 and a second cylinder end connected to a first rod 21a that is axially coupled to the first rotating plate 18, and a first lever 24 having a first lever end hingedly coupled to a first axle 22 that is coupled to the first rod 21a, and a second lever end that is hingedly coupled to a bracket 23.

By such a construction, an extension operation of the first rod 21a of the first cylinder 21 pushes the first axle 22 whereby a linear motion of the first rod 21a is converted into a rotational motion by an action of the first lever 24 that is hingedly coupled to the bracket 23. This operation rotates the first rotating plate 18 with respect to axle 36.

The transferring member 19, installed to be removed from the first rotating plate 18, is also provided with a first holding means for folding the carrier 3 and preventing the carrier 3 from being dropped when the first rotating plate 18 is rotated.

On each of left and right sides of an inlet of the transferring member 19, there is fixedly provided a guider 25 having a slant surface 25a thereof formed for easy insertion of the carrier 3 into the inside of the transferring member 19.

A first holding means for holding the carrier 3 transferred to the inside of the transferring member 19 is rotatably installed on the transferring member 19, and has a pair of fingers (second finger 26, and first finger 27) for holding a supporting member 3a of the carrier 3, and a second cylinder 28 having a body 28a hingedly coupled to the first finger 27 and a rod 28b hingedly coupled to the second finger 26, and which is operated in such a way that the fingers are simultaneously rotated respectively inwardly or outwardly toward or from each other. Further, the transferring member 19 is removably coupled to the first rotating plate 18 to be operated like a drawer.

The removal or insertion operation of the transferring member 19 from or into the first rotating plate 18 is made by a first removal/insertion means under a state such that the first rotating plate 18 is rotated by 90-degrees using the loading side driving means when the shutter 17 of the heating chamber 10 is opened.

The first removal/insertion means comprises a fourth axle 30 pivotally installed on one side of the first rotating plate 18, a pair of first and second pinions 31 respectively fixed to the first and second ends of the fourth axle 30, a rack 32 fixed at left and right sides of a bottom surface of the transferring member 19 for respective engagement with the first and second pinions 31, and a power transmission means for clockwise or counter-clockwise rotation of the fourth axle 30.

The power transmission means is operated to transmit power to the transferring means 19 that is removably coupled to the first rotating plate 18, and comprises a motor 33 fixed to the first rotating plate 18, and a timing belt 35 looped around a first pulley 34a that is coupled to the motor 33 and a second pulley 34b that is coupled to an end of the fourth axle 30. Its purpose is transmission of power to the fourth axle 30.

Operation of the thus constructed loading side rotator will be described.

Figure 4A:
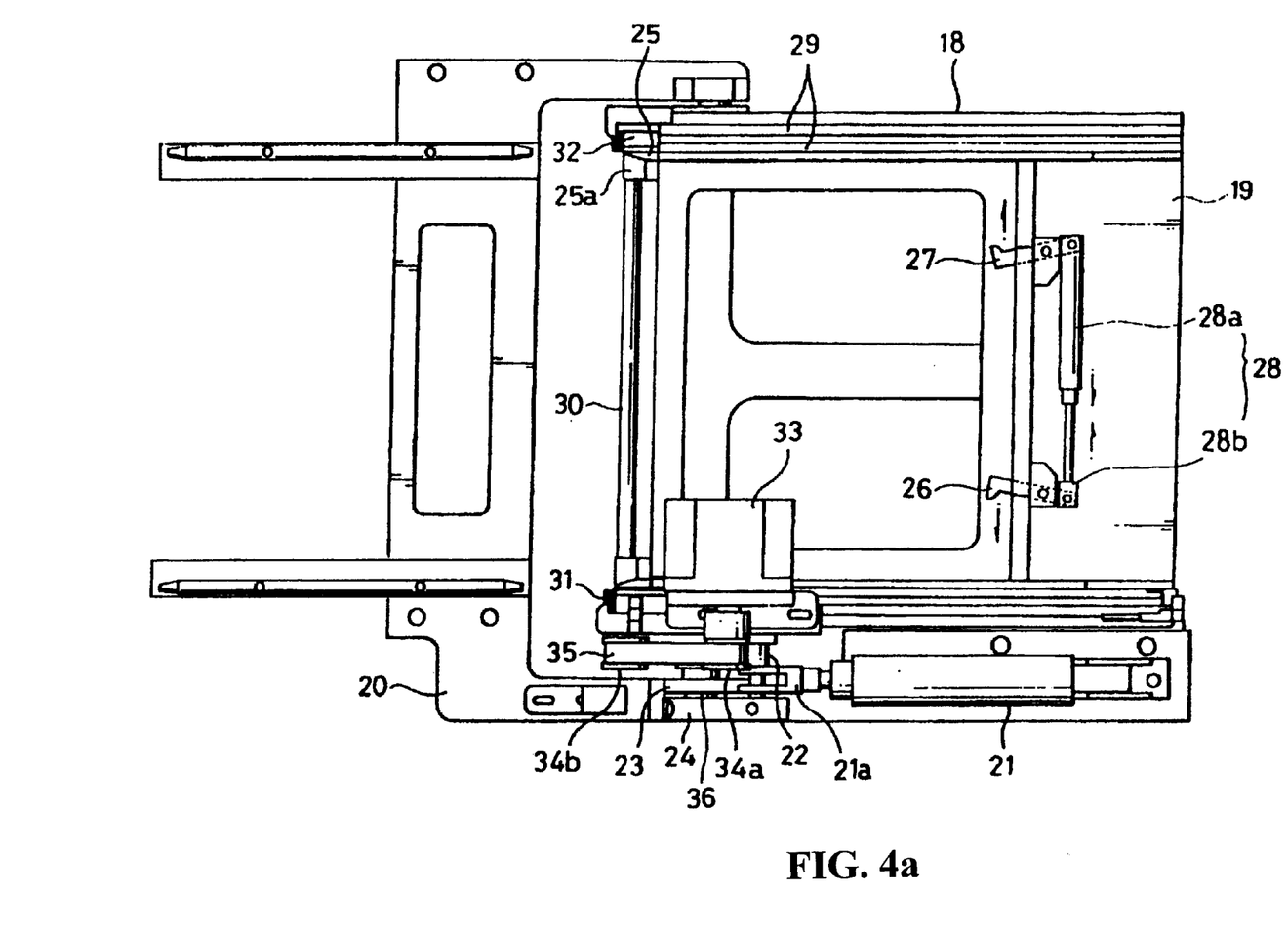
FIG. 4a illustrates a state before a carrier is transferred to a transferring member in a first rotating plate.

As shown in FIG. 4a, a pair of fingers (second finger 26, and first finger 27) remains spread outwardly before the carrier 3 is moved into the transferring member 19 in the first rotating plate 18. In such a state, when the carrier 3 is transferred into the transferring member 19, along guide rail 29 by the first transferring means 9, the carrier 3 is guided to the slant surfaces 25a of the guider 25, which are provided at respective left and right sides of the inlet of the transferring member 19, and then easily introduced into the inside of the transferring member 19.

Figure 4B:
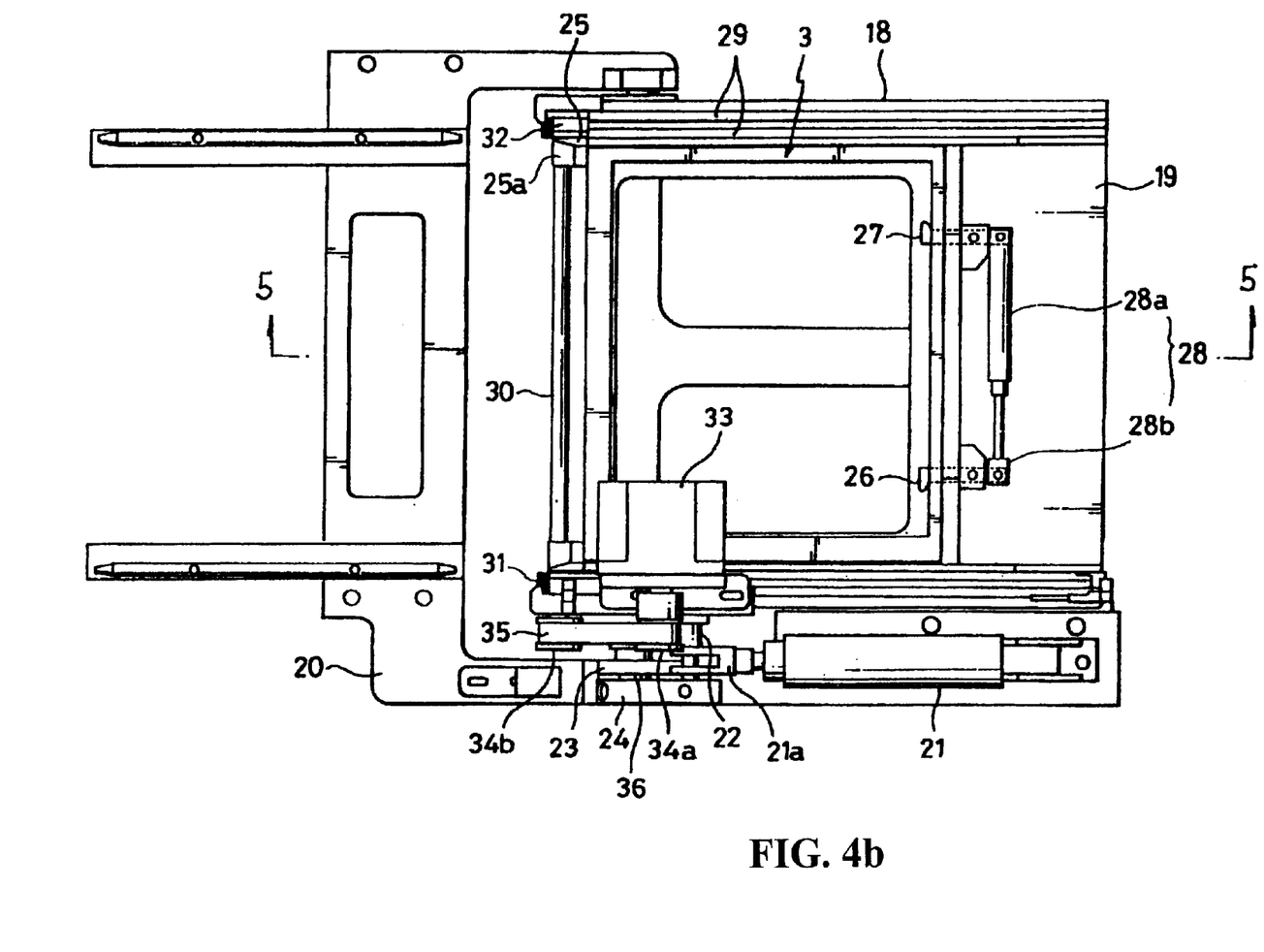
FIG. 4b illustrates a state in which fingers hold a carrier that is seated in a transferring member.

By the inward driving (shortening or retracting) of the second cylinder 28 acting as the holding means, the respective second and first fingers 26, 27 are simultaneously rotated away from each other to hold the supporting member 3a of the carrier 3, as shown in FIG. 4b. Therefore, at the time when the rotating plate 19 is rotated, the dropping of the carrier 3 introduced inside the transferring member 19 can be prevented. That is, in such a state, the carrier 3 is introduced inside the transferring member 19, and air pressure is decreased to the cylinder 28, which causes the second rod 28b to retract. Therefore, the fingers 26 and 27 are rotated to hold the supporting member 3a of the carrier 3.

If the cylinder 28 continues to be retracted under such a state that the fingers 26 and 27 hingedly coupled respectively to the second rod 28b and the cylinder body 28a hold the supporting member 3a of the carrier 3, continued retraction of the second rod 28b is made against a supporting point, which is the supporting members 3a to which the fingers 26 and 27 are applied, as shown in FIG. 4b.

After the interlocking pair of fingers 26, 27 hold the carrier 3 using second cylinder 28, the first cylinder 21 is driven for rotating the first rotating plate 18.

Thus, the linear motion of the first lever 24 coupled to the first rotating plate 18 on the first axle 22 is converted into rotational motion, which is then transmitted to the first rotating plate 18, whereby the first rotating plate 18 is rotated by 90 degrees with the respect to the axle 36.

Figure 5A:
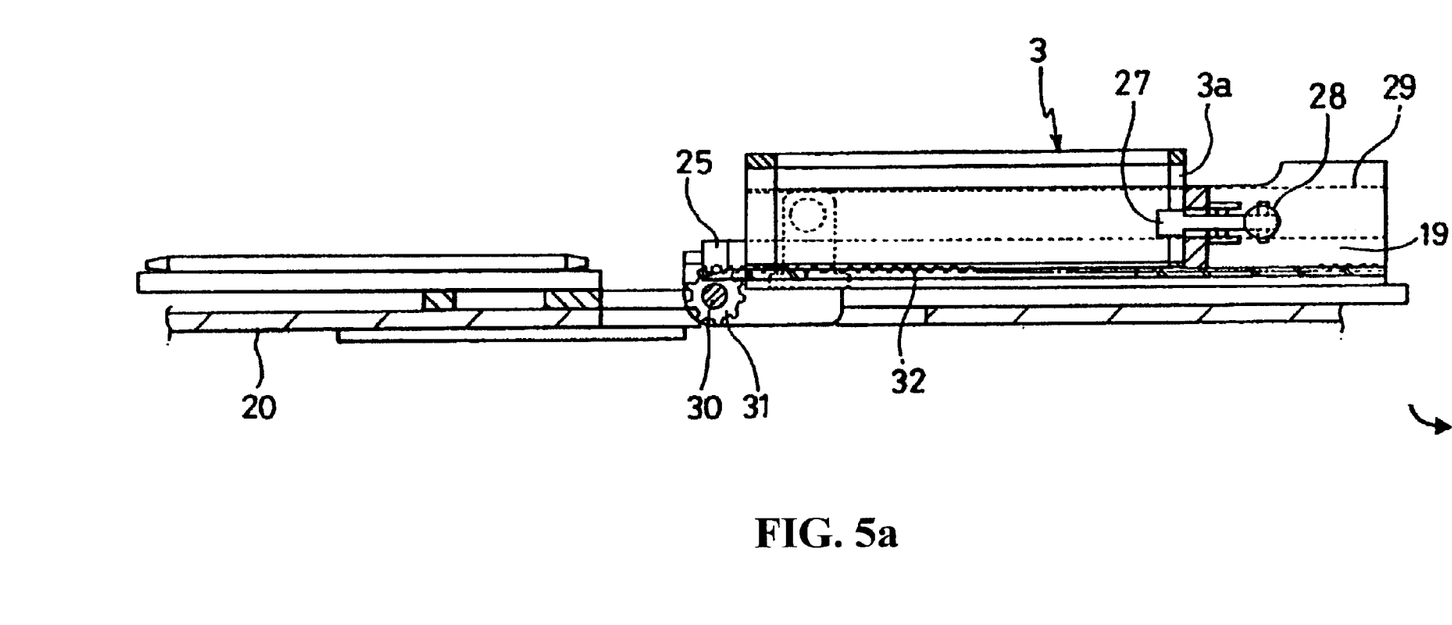
FIG. 5a is a vertical sectional view as seen in a state in which a carrier is transferred to the inside of a heating chamber.

When the shutter 17 (which is installed to be opened or closed on an upper side of the heating chamber 10) is opened, and the first rotating plate 18 is rotated by 90 degrees, transfer of the carrier 3 (having been held in the transferring member 19) to the inside of the heating chamber 10 becomes possible.

Motor 33 (as part of a first removal/insertion means) may be driven to transfer the carrier 3 (having been held in the transferring member 19) to the inside of the heating chamber 10. To effect this, rotational force generated from the motor 33 is transmitted through the timing belt 35 to rotate the fourth axle 30. In addition, the pinions 31, which are fixed to the fourth axle 30, are rotated therewith.

With the rotation of pinions 31, the transferring member 19, which is coupled to the first rotating plate 18 in such a manner as to be operated like a drawer, is removed from the rotating plate 18 due to an engagement. of the pinions 31 with the rack 32 fixed to the transferring member 19, and then introduced inside the heating chamber 10.

Figure 5B:
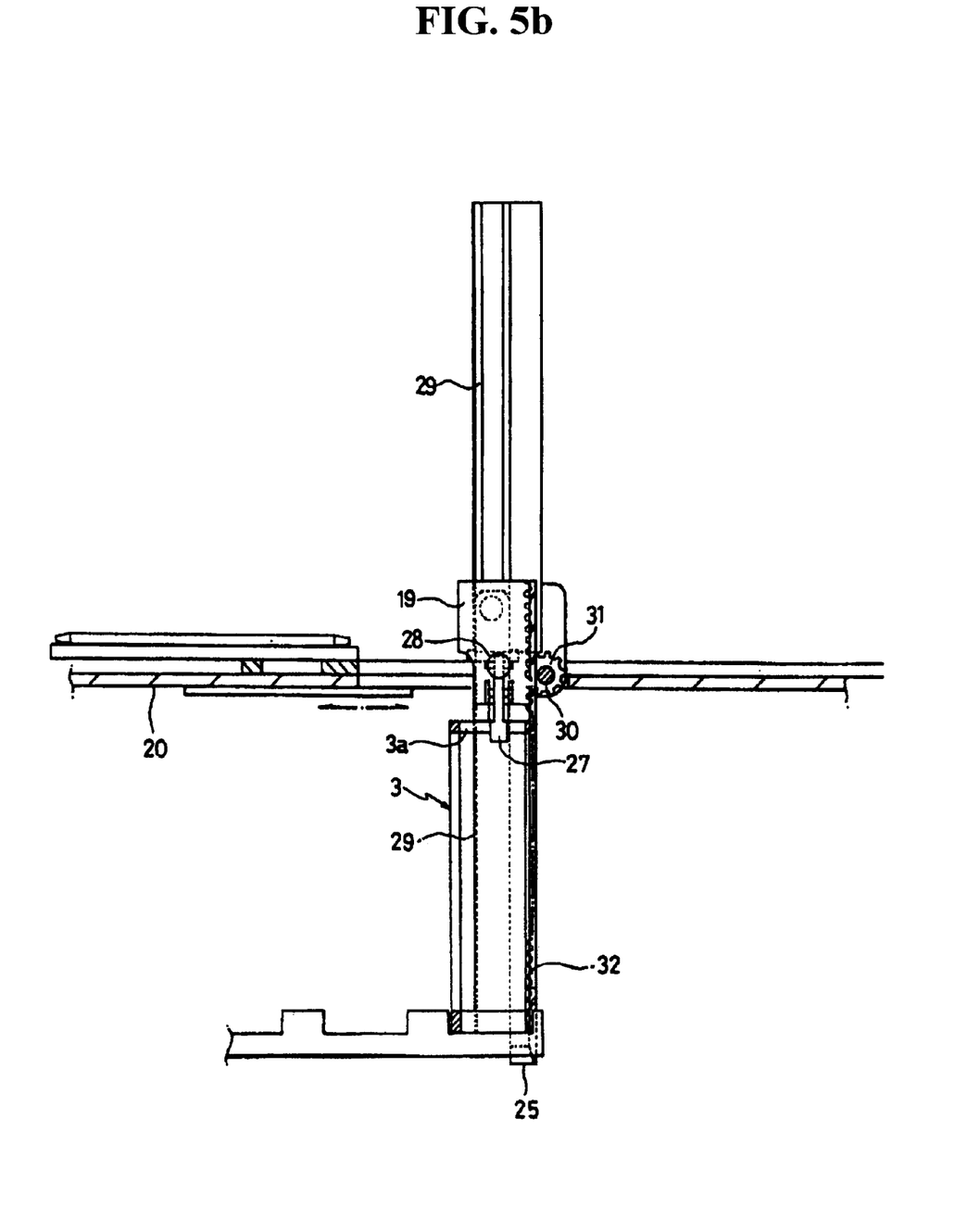
FIG. 5b is a side view as seen in a state in which a carrier is transferred to the inside of a heating chamber.

By such an operation, as shown in FIG. 5b, the carrier 3 held in the transferring member 19 is introduced inside the heating chamber 10 and then placed on a top surface of seating plate (not shown). Thereafter, the cylinder 28 used as a holding means is driven, so that the fingers 26, 27 are rotated inwardly toward each other to release the holding state of the carrier 3.

After the holding state of the carrier is released by the fingers 26, 27, the motor 33 rotates fourth axle 30 in opposite direction described above. Such rotation of fourth axle 30 elevates the transferring member 19 that is engaged with the pinions 31 through the rack 32 up to a top dead point, at which point the member 19 is introduced inside the first rotating plate 18.

After the removed transferring member 19 is introduced inside the first rotating plate 18, the shutter 17 is closed again, and the first rotating plate 18 is rotated by 90 degrees to return it to its initial state. Therefore, a new carrier can now be transferred inside the heating chamber 10.

On the other hand, as shown in FIGS. 6 to 8b, the unloading side rotator of the module IC handler is provided with a second rotating plate 49 that is rotatable with respect to a pivotal axle 48 at one side of a discharging side shutter of a test site 11 (see FIG. 1). On both upper and lower sides of the second rotating plate 49, there is provided a guide plate 50 having a slant surface 50a provided for an easy insertion of the carrier 3. Further, the second rotating plate 49 is adapted to be rotated by 90 degrees by an unloading side driving means.

Figure 6:
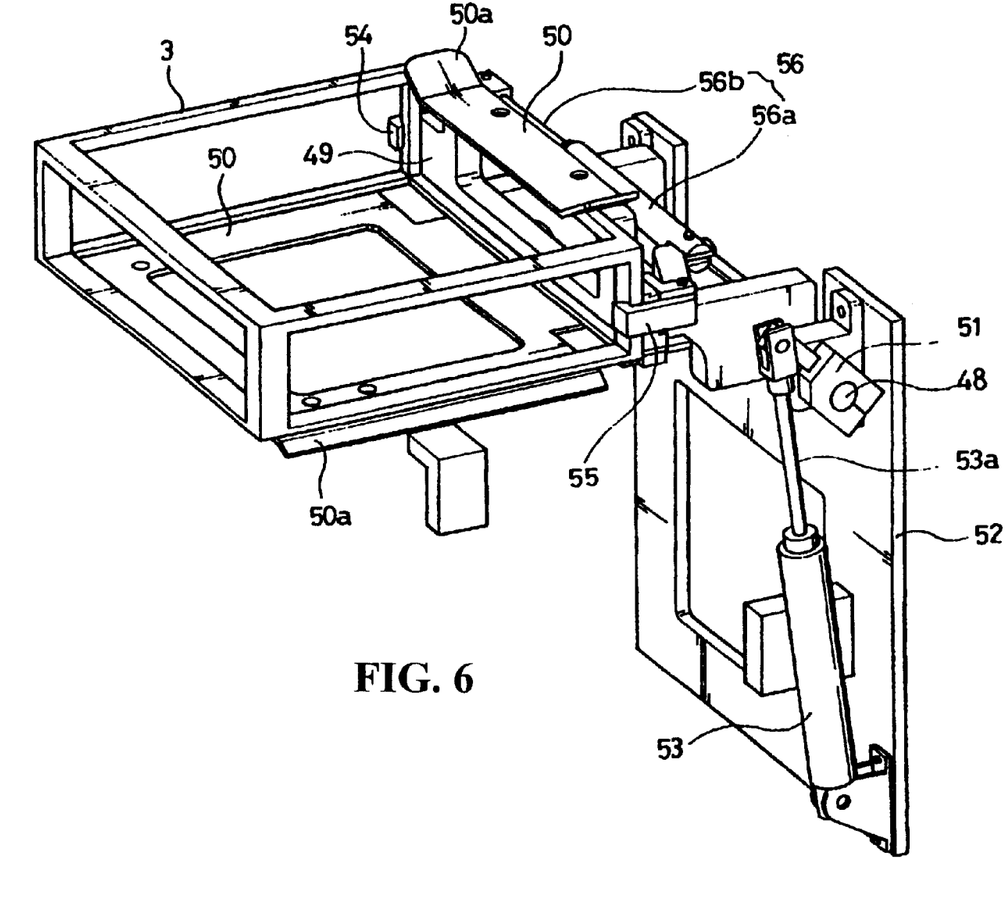
FIG. 6 is a perspective view of an unloading side rotator as one of the main components of the invention.

The unloading side driving means includes a second lever 51 having a first end fixed to the pivotal axle 48 of the second rotating plate 49, and a third cylinder 53 having one end hingedly coupled to an installation plate 52 and a third rod 53a hingedly coupled to a second end of the second lever 51 to rotate the second rotating plate 49.

By such a construction, an extension of the third rod 53a of the third cylinder 53 pushes the second lever 51 whereby a linear motion of the third rod 53a is converted into rotational motion by action of the second lever 51. This rotates the second rotating plate 49. The second rotating plate 49 is also provided with a second holding means for preventing the carrier 3 from being dropped when the second rotating plate 49 is rotated.

Figure 7A:
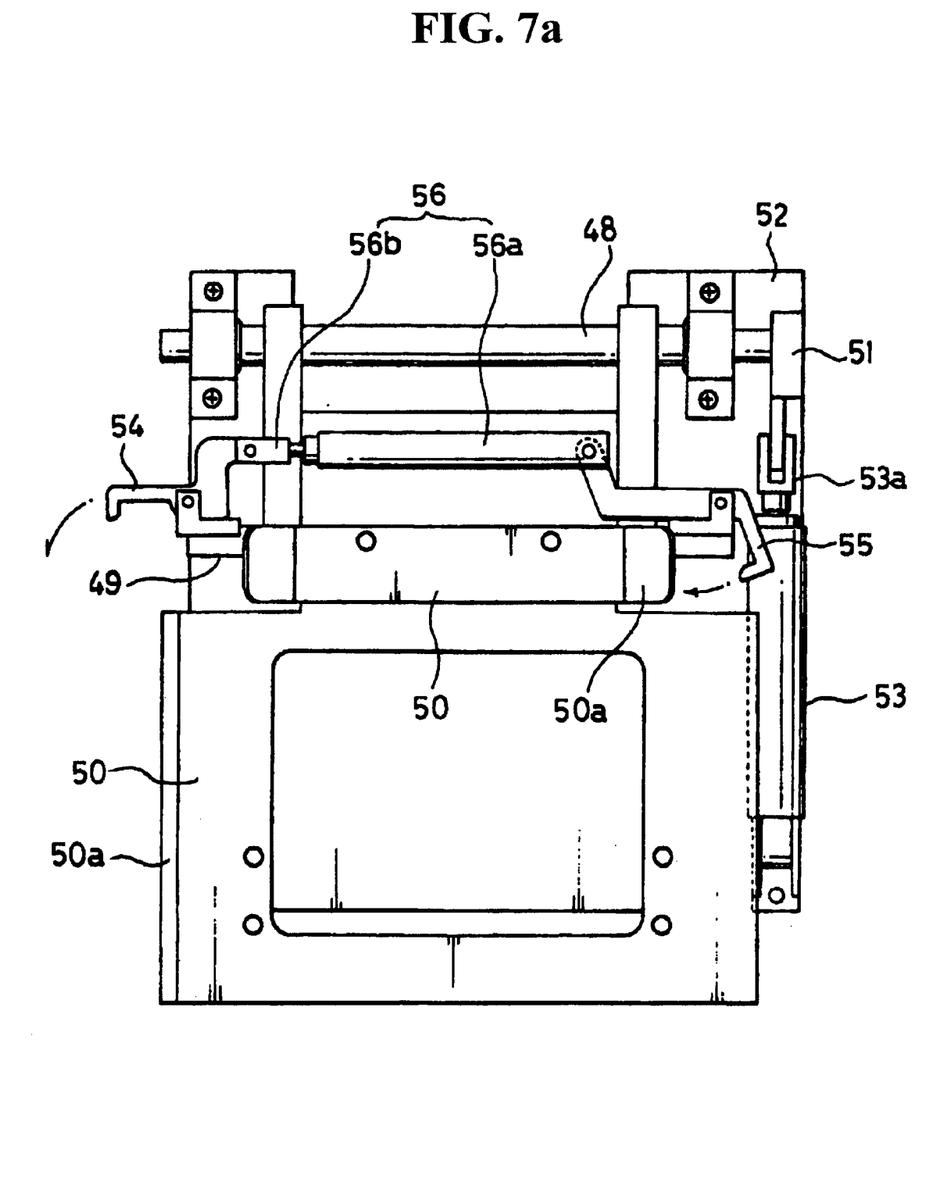
FIG. 7a illustrates a state before a carrier is transferred to the inside of a second rotating plate.

The second holding means holding the carrier 3 transferred with the aid of the guider plate 50, as shown in FIG. 7a, includes a pair of fingers (fourth finger 54, and third finger 55) rotatably installed on the second rotating plate 49 for respectively holding respective side surfaces of the carrier 3, and a fourth cylinder 56 having a body 56a hingedly coupled to the third finger 55 and a fourth rod 56b hingedly coupled to the fourth finger 54, and which is operated in such a way that the third and fourth fingers are simultaneously rotated inwardly or outwardly to move respectively toward or from each other.

The operation of the thus constructed unloading side rotator will be described.

Figure 8A:
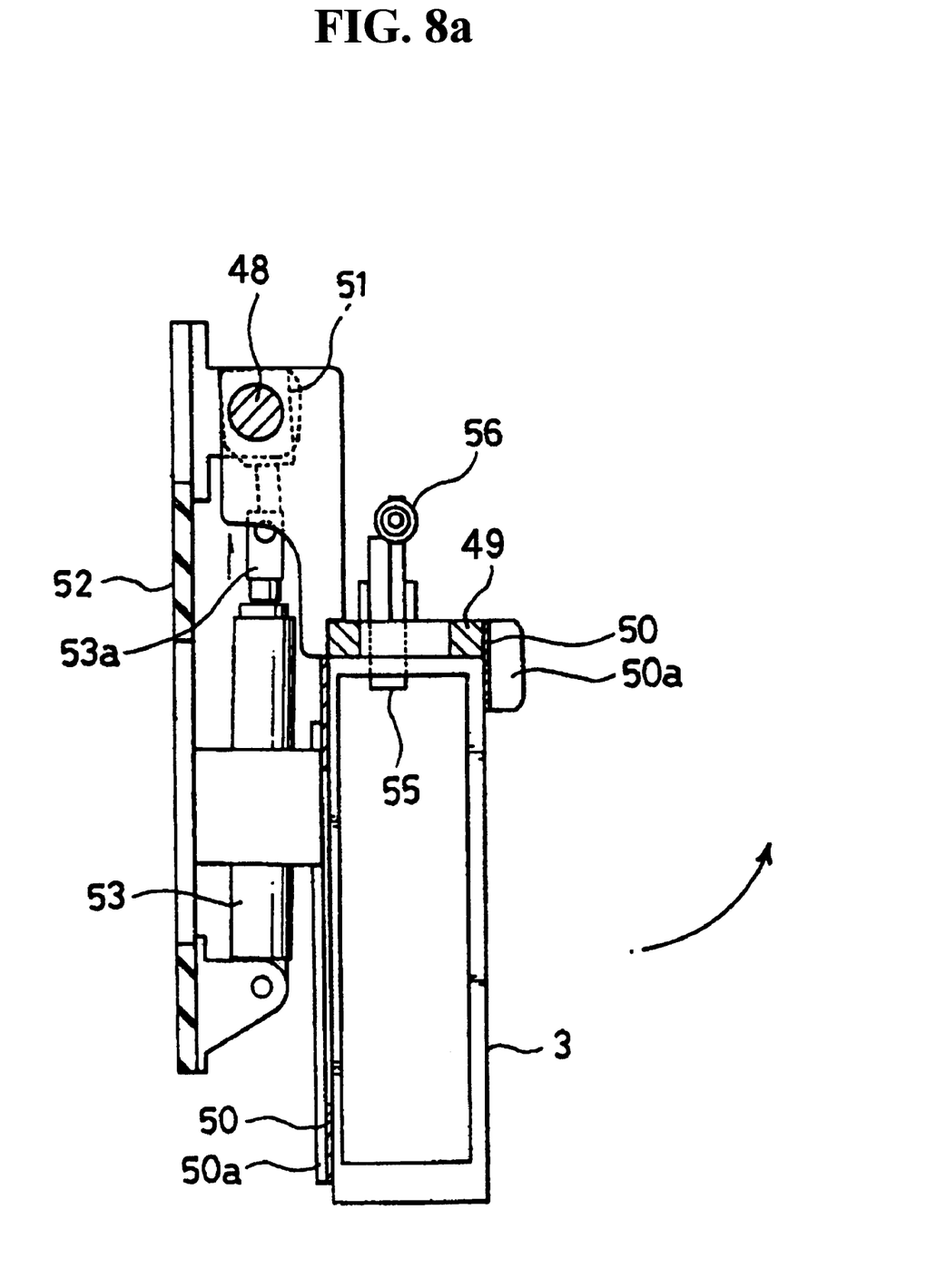
FIG. 8a is a sectional view taken along line A—A in FIG. 7b.

As shown in FIG. 8a, the second rotating plate 49 abuts the installation plate 52. The pair of fingers 54, 55 remains spread outwardly as shown in FIG. 7a while the module ICs contained in the upright carrier 3 are being tested in the test site 11. After tests for the module ICs are completed, the discharging side shutter (not shown) located in the test site 11 is opened, and the transferring means stably introduces the carrier 3 with the aid of the guide plates 50 having outward slant surfaces 50a.

After that, a sensor senses a sensor plate (not shown) fixed at a lower portion of a slider acting as a tramsferromg means, by which a controller can recognize that the carrier 3 is inside the second rotating plate 49.

Figure 7B:
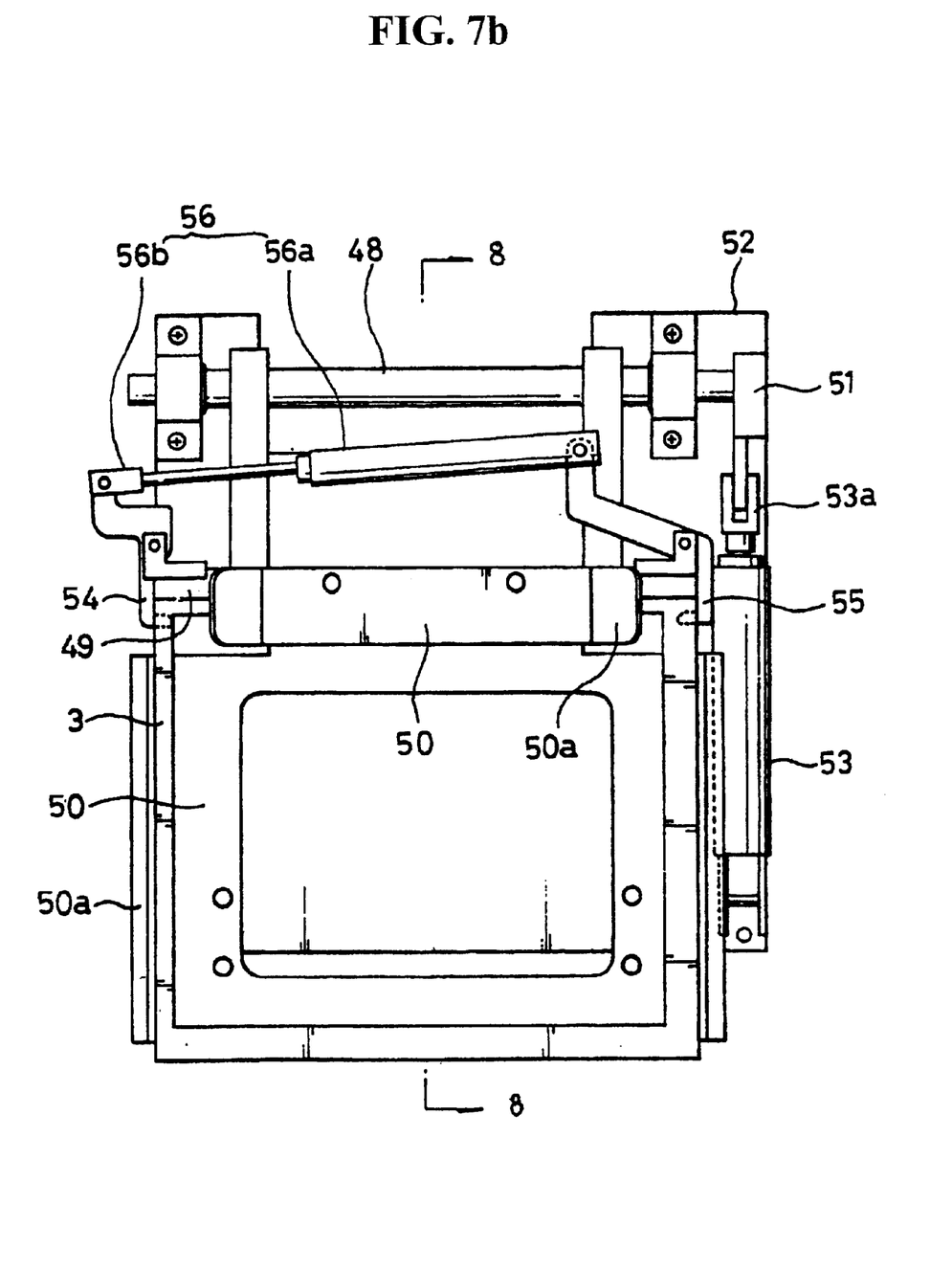
FIG. 7b illustrates a state in which fingers hold a carrier that is transferred to a second rotating plate.

Thereafter, the fourth cylinder 56 of the second holding means is retracted, which assures that the pair of fingers 54, 55 are rotated inwardly toward each other. FIG. 7b shows that the fingers 54, 55 hold respective side surfaces of the carrier 3 to prevent the dropping of the carrier 3 inside the second rotating plate 49 when the second rotating plate 49 is rotated. Once the carrier 3 is introduced inside the second rotating plate 49, an air pressure is applied to the fourth cylinder 56, which advances the fourth rod 56b from its previous retracted state. Thus, fingers 54 and 55 are rotated to hold respective side surfaces of the carrier 3.

After the interlocking pair of fingers 54, 55 holds the carrier 3 by using fourth cylinder 56, the third cylinder 53 is driven to rotate the second rotating plate 49.

Figure 8B:
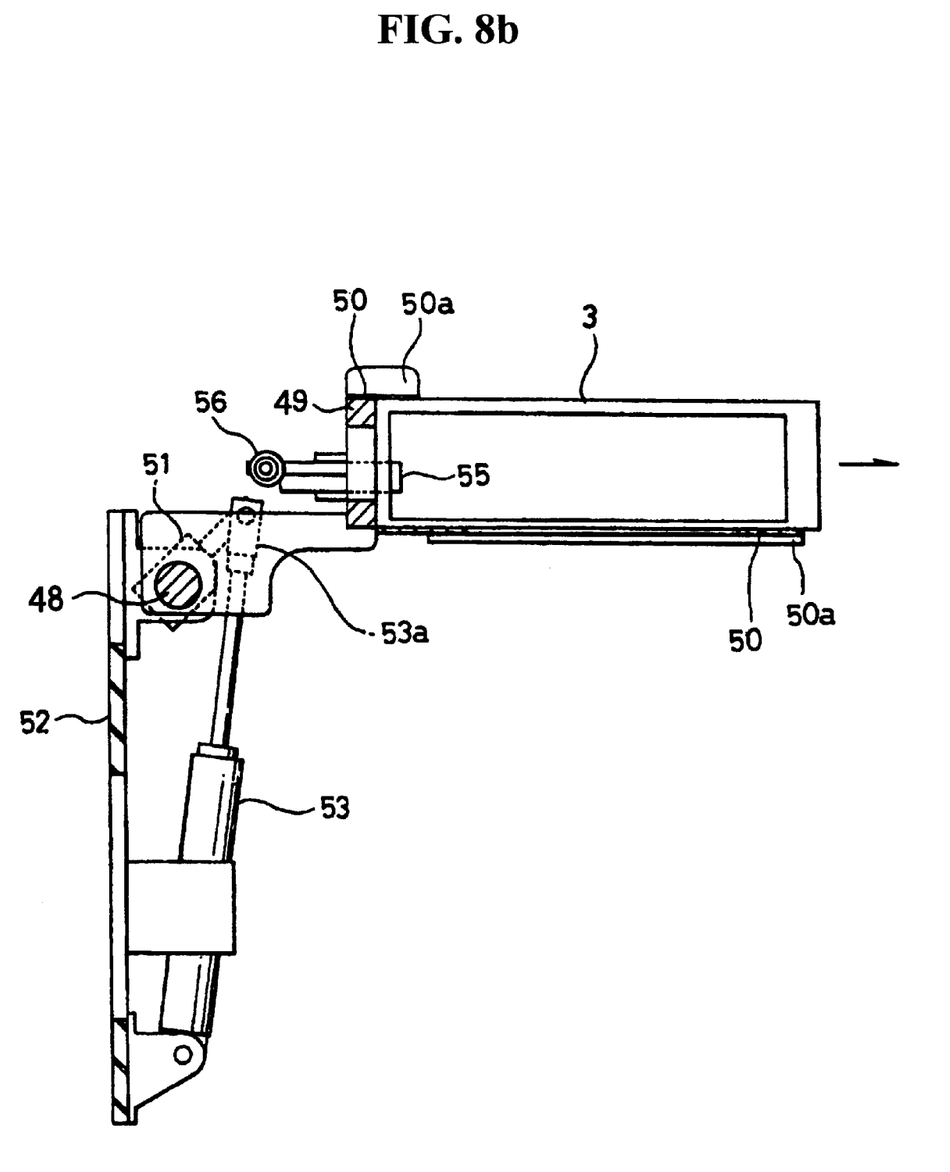
FIG. 8b illustrates a state in which a carrier is rotated by 90-degrees so that the carrier in the second rotating plate maintains the same horizontal level as an unloading location.

Thus, linear motion of the third rod 53*a* is coupled to the pivotal axle 48 of the second rotating plate 49 to convert linear motion into rotational motion, which is then transmitted to the second rotating plate 49, whereby the second rotating plate 49 is rotated by 90 degrees, as shown in FIG. 8*b*.

When the carrier 3 becomes located on the same horizontal line as the unloading location 13 after the second rotating plate 49 is rotated by 90 degrees to a horizontal position, the fourth cylinder 56 is retracted, so that the fingers 54, 55 are rotated outwardly from each other to release the holding state of the carrier 3.

After the holding state of the carrier 3 is released, the second transferring means holds the carrier 3 in the second rotating plate 49 and then transfers it to the unloading location 13. Therefore, it is possible to classify the tested module ICs contained in the carrier 3 based upon the test results and to unload them into the customer tray.

As described above, according to the present invention, the first rotating plate 18, to which the transferring member 19 is removably coupled, is rotated by 90 degrees, after which the power transmission, via the rack 32 and pinions 31, enables transfer of the transferring member 19 holding the carrier 3 to the inside of the heating chamber. Thereafter, the carrier, standing upright, can be transferred toward the test site.

Thus, the socket assembly, with which patterns of the module ICs are electrically brought into contact during the test, can stand upright, allowing the upright socket assembly to be exposed outside of the test site. Therefore, even if the type of the module ICs to be tested is changed, an easy exchange of the test socket can be achieved in the test site. Further, since the area required to install the carrier transferring apparatus can be. minimized, beneficial compactness can be obtained for the entire apparatus.

Further, since the carrier 3 can be rotated by 90 degrees to a horizontal position at the unloading location without having to transfer the carrier 3, the time taken to transfer the carrier can be significantly reduced.

What is claimed is:

1. A module IC test handler, comprising:
   a test station located inside a testing chamber, wherein the test station is configured to test module ICs loaded in a module IC carrier;
   a loading side rotator, comprising:
     a rotating plate mounted over a loading side of the testing chamber and configured to rotate between a horizontal orientation and a vertical orientation, and
     a holding and transferring device mounted on the rotating plate, wherein the holding and transferring device is configured to hold a module IC carrier on the rotating plate as the rotating plate transitions between the horizontal and vertical positions, and wherein the holding and transferring device is configured to insert a module IC carrier into the testing chamber after the rotating plate has assumed the vertical position; and
   an unloading side rotator.

2. The module IC test handler of claim 1, further comprising a driving mechanism configured to cause the rotating plate to transition between the horizontal and vertical orientations.

3. The module IC test handler of claim 2, wherein the driving mechanism comprises a cylinder and piston having a first end coupled to a bracket fixed to a frame of the test handler and a second end functionally coupled to the rotating plate.

4. The module IC test handler of claim 3, wherein the driving mechanism is configured such that when the piston extends from the cylinder, the rotating plate is rotated from the horizontal orientation to the vertical orientation.

5. The module IC test handler of claim 4, wherein the driving mechanism also comprises a lever functionally coupled the rotating plate, wherein the lever has a first end coupled to a bracket fixed to the frame of the test handler, and a second end coupled to the piston.

6. The module IC test handler of claim 1, wherein the holding and transferring device comprises:
   a holding mechanism configured to hold a module IC carrier on the rotating plate as the rotating plate transitions between the horizontal and vertical orientations; and
   a transferring device configured to insert the module IC carrier into the testing chamber after the rotating plate has assumed the vertical orientation.

7. The module IC test handler of claim 6, wherein the holding mechanism is configured to release the module IC carrier after it has been inserted into the testing chamber, and wherein the transferring device is configured to withdraw from the testing chamber after the module IC carrier has been released.

8. The module IC test handler of claim 6, wherein the transferring device comprises a movable shuttle, and wherein the transferring device is configured such that after the rotating plate has assumed the vertical orientation, the shuttle is movable between a first position located above the testing chamber and a second position located inside the testing chamber.

9. The module IC test handler of claim 8, wherein the transferring device further comprises:
   a rack mounted on the movable shuttle;
   a pinion gear rotatably mounted on the rotating plate, wherein the pinion gear engages the rack on the movable shuttle; and
   a motor coupled to the pinion gear and configured to rotate the pinion gear, wherein rotation of the pinion gear in a first direction causes the movable shuttle to move into the testing chamber, and wherein rotation of the pinion gear in a second direction causes the movable shuttle to withdraw from the testing chamber.

10. The module IC test handler of claim 6, wherein the holding mechanism comprises at least one finger that is movable between a first position where the at least one finger engages and holds a module IC carrier on the rotating plate and a second position where the module IC carrier is released from the rotating plate.

11. The module IC test handler of claim 6, wherein the holding mechanism comprises:
   a pair of fingers that are configured to move between first positions where the fingers engage and hold a module IC carrier on the rotating plate and second positions where the module IC carrier is released from the rotating plate; and
   a piston and cylinder coupled to the pair of fingers and configured to move the fingers between the first and second positions.

12. The module IC test handler of claim 1, wherein the unloading side rotator comprises:
   a clamping mechanism configured to clamp onto a module IC carrier; and
   a rotating mechanism configured to rotate the clamping mechanism between vertical and horizontal positions.

13. The module IC test handler of claim 12, wherein the clamping mechanism comprises:

a bracket that is rotatably mounted on a frame of the module IC test handler;

at least one finger that is mounted on the bracket and that is configured to move between a first position where the at least one finger clamps onto a module IC carrier and a second position where the module IC carrier is released by the at least one finger; and a clamping drive mechanism configured to move the at least one finger between the first and second positions.

14. The module IC test handler of claim 13, wherein the clamping drive mechanism comprises a piston and cylinder.

15. The module IC test handler of claim 14, wherein the at least one finger comprises a first finger coupled to the piston and a second finger coupled to the cylinder, and wherein movement of the piston into and out of the cylinder causes the first and second fingers to move between the first and second positions.

16. The module IC test handler of claim 12, wherein the rotating mechanism comprises a piston and cylinder, wherein one of the piston and cylinder is coupled to the clamping mechanism, wherein the other of the piston and cylinder is coupled to a fixed bracket on a frame of the module IC test handler, and wherein movement of the piston into and out of the cylinder causes the clamping mechanism to move between the vertical and horizontal positions.

17. The module IC test handler of claim 12, wherein the rotating mechanism comprises:

an axle that is coupled to the clamping mechanism and that is rotatably mounted on a frame of the module IC test handler;

a lever arm coupled to the axle; and a piston and cylinder, wherein one of the piston and cylinder is coupled to the lever arm, wherein the other of the piston and cylinder is coupled to a fixed bracket on the frame of the module IC test handler, and wherein movement of the piston into and out of the cylinder causes the clamping mechanism to move between the vertical and horizontal positions.

18. A module IC test handler, comprising:

a test station located inside a testing chamber, wherein the test station is configured to test module ICs loaded in a module IC carrier;

a loading side rotator configured to load a module IC carrier into the testing chamber; and an unloading side rotator configured to unload module IC carriers from the testing chamber, wherein the unloading side rotator comprises:

a clamping mechanism configured to clamp onto a module IC carrier, and a rotating mechanism configured to rotate the clamping mechanism between vertical and horizontal positions.

19. The module IC test handler of claim 18, wherein the clamping mechanism comprises:

a bracket that is rotatably mounted on a frame of the module IC test handler;

at least one finger that is mounted on the bracket and that is configured to move between a first position where the at least one finger clamps onto a module IC carrier and a second position where the module IC carrier is released by the at least one finger; and a clamping drive mechanism configured to move the at least one finger between the first and second positions.

20. The module IC test handler of claim 19, wherein the clamping drive mechanism comprises a piston and cylinder.

21. The module IC test handler of claim 20, wherein the at least one finger comprises a first finger coupled to the piston and a second finger coupled to the cylinder, and wherein movement of the piston into and out of the cylinder causes the first and second fingers to move between the first and second positions.

22. The module IC test handler of claim 18, wherein the rotating mechanism comprises a piston and cylinder, wherein one of the piston and cylinder is coupled to the clamping mechanism, wherein the other of the piston and cylinder is coupled to a fixed bracket on a frame of the module IC test handler, and wherein movement of the piston into and out of the cylinder causes the clamping mechanism to move between the vertical and horizontal positions.

23. The module IC test handler of claim 18, wherein the rotating mechanism comprises:

an axle that is coupled to the clamping mechanism and that is rotatably mounted on a frame of the module IC test handler;

a lever arm coupled to the axle; and a piston and cylinder, wherein one of the piston and cylinder is coupled to the lever arm, wherein the other of the piston and cylinder is coupled to a fixed bracket on the frame of the module IC test handler, and wherein movement of the piston into and out of the cylinder causes the clamping mechanism to move between the vertical and horizontal positions.

\* \* \* \* \*